US009720063B2

(12) United States Patent
Sperl et al.

(10) Patent No.: US 9,720,063 B2
(45) Date of Patent: Aug. 1, 2017

(54) DIFFUSION SPECTRUM IMAGING SYSTEMS AND METHODS

(71) Applicant: General Electric Company, Schenectady, NY (US)

(72) Inventors: Jonathan Immanuel Sperl, Freising (DE); Christopher Judson Hardy, Schenectady, NY (US); Luca Marinelli, Schenectady, NY (US); Ek Tsoon Tan, Mechanicville, NY (US); Kevin Franklin King, Menomonee Falls, WI (US); Marion Irene Menzel, Munich (DE)

(73) Assignee: General Electric Company, Niskayuna, NY (US)

( * ) Notice: Subject to any disclaimer, the term of this patent is extended or adjusted under 35 U.S.C. 154(b) by 1261 days.

(21) Appl. No.: 13/718,119

(22) Filed: Dec. 18, 2012

(65) Prior Publication Data

US 2014/0167753 A1    Jun. 19, 2014

(51) Int. Cl.
    *G01R 33/563*    (2006.01)
(52) U.S. Cl.
    CPC ............... *G01R 33/56341* (2013.01)
(58) Field of Classification Search
    USPC .......... 324/300–322; 600/407–435; 382/128–131
    See application file for complete search history.

(56) References Cited

U.S. PATENT DOCUMENTS

| 7,777,487 B2 | 8/2010 | Ying et al. |
| 7,817,838 B2 | 10/2010 | DiBella et al. |
| 8,194,937 B2 | 6/2012 | Chen |

(Continued)

FOREIGN PATENT DOCUMENTS

| WO | 2012037067 A1 | 3/2012 |
| WO | 2012088031 A2 | 6/2012 |

OTHER PUBLICATIONS

Justin P. Haldar, et al.; "Improved Diffusion Imaging Through SNR-Enhancing Joint Reconstruction"; Full Papers, Magnetic Resonance in Medicine 000:000-000 (2012); 2012 Wiley Periodical, Inc.; pp. 1-13.

(Continued)

*Primary Examiner* — Melissa Koval
*Assistant Examiner* — Tiffany Fetzner
(74) *Attorney, Agent, or Firm* — Pabitra K. Chakrabarti (57) ABSTRACT

Systems and methods for generating a magnetic resonance (MR) image of a tissue are provided. A method includes acquiring MR raw data. The MR raw data corresponds to MR signals obtained at undersampled q-space locations for a plurality of q-space locations that is less than an entirety of the q-space locations and the MR signals at the q-space locations represent the three dimensional displacement distribution of the spins in the imaging voxel. The method also includes performing a joint image reconstruction technique on the MR raw data to exploit structural correlations in the MR signals to obtain a series of accelerated MR images and performing, for each image pixel in each accelerated MR image of the series of accelerated MR images, a compressed sensing reconstruction technique to exploit q-space signal sparsity to identify a plurality of diffusion maps.

21 Claims, 5 Drawing Sheets

(56) References Cited

U.S. PATENT DOCUMENTS

| | | | | |
|---|---|---|---|---|
| 8,908,951 B2* | 12/2014 | Menzel | ............ | G01R 33/56341 |
| | | | | 382/131 |
| 8,922,210 B2* | 12/2014 | Marinelli | ......... | G01R 33/56341 |
| | | | | 324/309 |
| 2009/0262996 A1 | 10/2009 | Samsonov et al. | | |
| 2010/0308824 A1 | 12/2010 | Grady et al. | | |
| 2011/0241677 A1 | 10/2011 | Busse et al. | | |
| 2012/0249136 A1* | 10/2012 | Marinelli | ......... | G01R 33/56341 |
| | | | | 324/309 |
| 2013/0278257 A1* | 10/2013 | Boada | ............. | G01R 33/56341 |
| | | | | 324/309 |
| 2014/0167753 A1* | 6/2014 | Sperl | ................ | G01R 33/56341 |
| | | | | 324/309 |
| 2014/0185894 A1* | 7/2014 | Menzel | ............ | G01R 33/56341 |
| | | | | 382/131 |
| 2016/0334489 A1* | 11/2016 | Sperl | ................ | G01R 33/56341 |
| 2016/0356873 A1* | 12/2016 | Topgaard | ......... | G01R 33/56341 |

OTHER PUBLICATIONS

Marion I. Menzel, et al.; "Accelerated Diffusion Spectrum Imaging in the Human Brain"; Imaging Methodology—Communications, Magnetic Resonance in Medicine 66:1226-1233 (2011).

* cited by examiner

DIFFUSION SPECTRUM IMAGING SYSTEMS AND METHODS

BACKGROUND

The subject matter disclosed herein relates generally to magnetic resonance imaging (MRI) systems and, more particularly, to systems and methods for performing diffusion spectrum imaging (DSI) with an MRI system.

In general, magnetic resonance imaging (MRI) examinations are based on the interactions among a primary magnetic field, a radiofrequency (RF) magnetic field and time varying magnetic gradient fields with gyromagnetic material having nuclear spins within a subject of interest, such as a patient. Certain gyromagnetic materials, such as hydrogen nuclei in water molecules, have characteristic behaviors in response to external magnetic fields. The precession of spins of these nuclei can be influenced by manipulation of the fields to produce RF signals that can be detected, processed, and used to reconstruct a useful image.

DSI is an imaging technique for generating diffusion information that may be utilized in the clinical evaluation of various diseases, for example, traumatic brain injuries and/or multiple sclerosis. In DSI, the information is encoded in both q-space or diffusion space, as well as in image space. The q-space information may be used to characterize the diffusion properties of water molecules. More specifically, by applying a series of diffusion encoding gradient pulses in multiple directions and strengths, a three-dimensional characterization of the water diffusion process may be generated at each spatial location or image voxel. The MR signal in q-space is generally related to the water displacement probability density function at a fixed echo time by the Fourier transform. The diffusion information encoded in q-space may be separated into both angular and radial components. The angular component reflects the underlying tissue anisotropy, whereas the radial component (e.g., the radial kurtosis) provides information about the eventual geometric restrictions in the diffusion process.

Conventional DSI techniques typically provide useful information about the diffusion properties of water in an organ of interest, such as the brain, but are associated with a variety of drawbacks. For example, the high dimensionality of DSI often requires a patient to be positioned in an MRI scanner for a long period of time. For further example, the reconstructed MR images may include noise that makes it more difficult for a clinician to obtain useful information from the acquired images. Accordingly, there exists a need for improved systems and methods that address these drawbacks.

BRIEF DESCRIPTION

In one embodiment, a method for generating a magnetic resonance (MR) image of a tissue is provided. The method includes acquiring MR raw data. The MR raw data corresponds to MR signals obtained at undersampled q-space locations for a plurality of q-space locations that are fewer than an entirety of the q-space locations and the MR signals at the q-space locations represent the three dimensional displacement distribution of the spins in the imaging voxel. The method also includes performing a joint image reconstruction technique on the MR raw data to exploit structural correlations in the MR signals to obtain a series of accelerated MR images and performing, for each image pixel in each accelerated MR image of the series of accelerated MR images, a compressed sensing reconstruction technique to exploit q-space signal sparsity to identify a plurality of diffusion maps.

In another embodiment, non-transitory computer readable medium encoding one or more executable routines, which, when executed by a processor, cause the processor to perform acts including acquiring MR raw data. The MR raw data corresponds to MR signals obtained at undersampled q-space locations for a plurality of q-space locations that are fewer than an entirety of the q-space locations and the MR signals at the q-space locations represent the three dimensional displacement distribution of the spins in the imaging voxel. The processor also performs acts including performing a joint image reconstruction technique on the MR raw data to exploit structural correlations in the MR signals to obtain a series of accelerated MR images and performing, for each image pixel in each accelerated MR image of the series of accelerated MR images, a compressed sensing reconstruction technique to exploit q-space signal sparsity to identify a plurality of diffusion maps.

In another embodiment, a magnetic resonance (MR) system includes an imager having an MR magnet and being adapted to acquire MR raw data. The MR raw data corresponds to MR signals obtained at undersampled q-space locations for a plurality of q-space locations that is less than an entirety of the q-space locations, and the MR signals at the q-space locations represent the three dimensional displacement distribution of the spins in the imaging voxel. The system also includes control circuitry adapted to receive the MR raw data, to perform a joint image reconstruction technique on the MR raw data to obtain a series of accelerated MR images, and to perform, for each image pixel in each accelerated MR image of the series of accelerated MR images, a compressed sensing reconstruction technique to identify a plurality of diffusion maps.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

As described in more detail below, provided herein are systems and methods for performing diffusion spectrum imaging (DSI) using magnetic resonance imaging (MRI) systems. More specifically, various embodiments provided herein may employ joint image reconstruction (JIR) during imaging and compressed sensing (CS) reconstruction during q-space processing to exploit anatomical similarities in image space and signal sparsity in q-space to generate images with improved image quality as compared to traditional systems, which may exclusively utilize JIR or CS, or may employ neither. While one skilled in the art would likely recognize that JIR used during imaging and CS used during q-space processing are orthogonal to one another, it is now recognized and disclosed that by combining JIR and CS, a variety of advantages may be gained. For example, although JIR exploits spatial correlations between data in different anatomical slices and, thus, it would be unexpected to influence the q-space processing technique, it is now recognized that use of JIR during imaging may influence the quality of acceleration obtained during compressed sensing. These and other features of presently disclosed embodiments are described in more detail below.

The implementations described herein may be performed by a magnetic resonance imaging (MRI) system, wherein specific imaging routines are initiated by a user (e.g., a radiologist). For example, the implementations described herein may be applicable to a variety of types of diffusion acquisition schemes known to those skilled in the art. For further example, the disclosed embodiments may be utilized with DSI, diffusion tensor imaging (DTI), high angular resolution imaging, and so forth.

Further, the MRI system may perform data acquisition, data construction, image reconstruction/synthesis, and image processing. Accordingly, referring to FIG. 1, a magnetic resonance imaging system 10 is illustrated schematically as including a scanner 12, a scanner control circuit 14, and a system control circuitry 16. System 10 additionally includes remote access and storage systems or devices as picture archiving and communication systems (PACS) 18, or other devices, such as teleradiology equipment, so that data acquired by the system 10 may be accessed on-site or off-site. While the MRI system 10 may include any suitable scanner or detector, in the illustrated embodiment, the system 10 includes a full body scanner 12 having a housing 20 through which a bore 22 is formed. A table 24 is moveable into the bore 22 to permit a patient 26 to be positioned therein for imaging selected anatomy within the patient 26. The selected anatomy may be imaged by a combination of patient positioning, selected excitation of certain gyromagnetic nuclei within the patient 26, and by using certain features for receiving data from the excited nuclei as they spin and precess, as described below.

Figure 1:
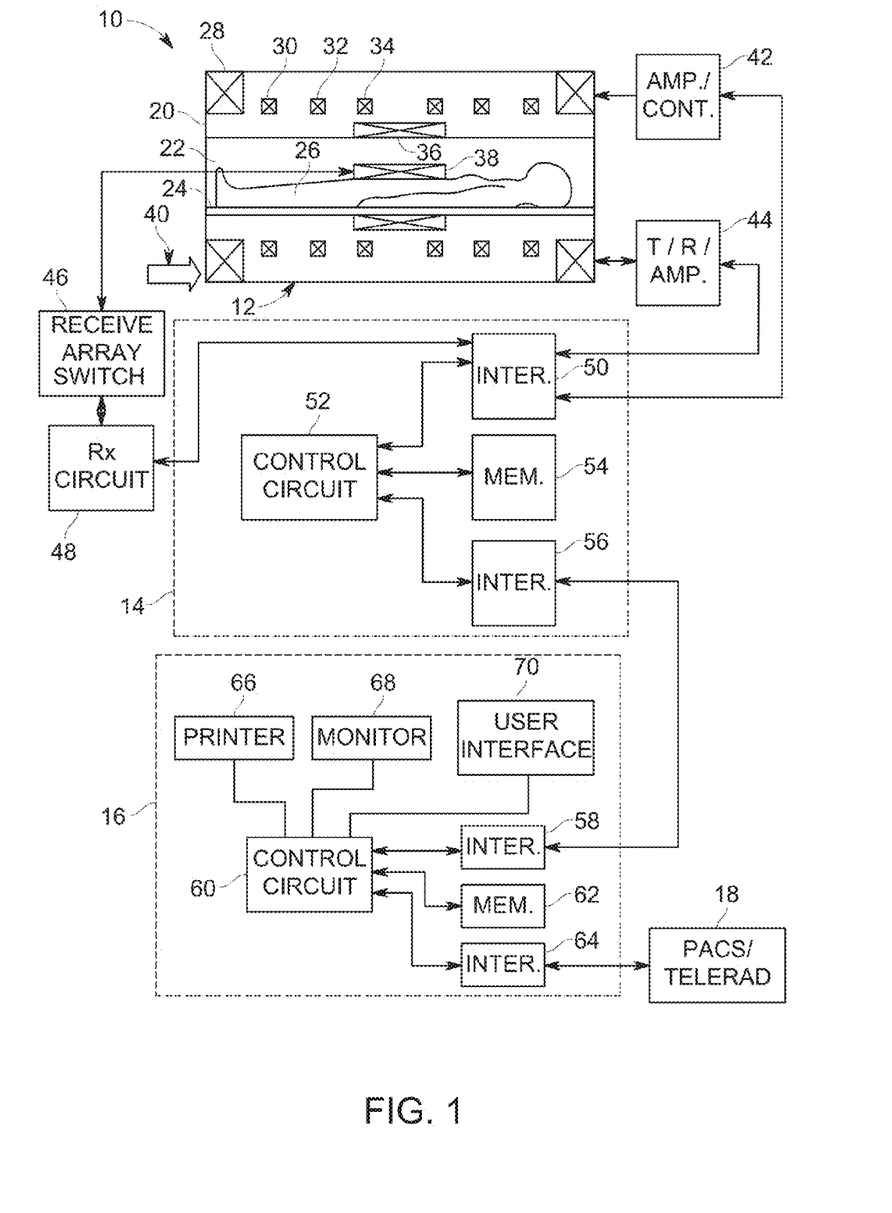
FIG. 1 is a diagrammatical illustration of an embodiment of a magnetic resonance (MR) imaging system configured to acquire MR images using an accelerated DSI technique in accordance with an aspect of the present disclosure.

Scanner 12 includes a series of associated coils for producing controlled magnetic fields for exciting the gyromagnetic material within the anatomy of the subject being imaged. Specifically, a primary magnet coil 28 is provided for generating a primary magnetic field generally aligned with the bore 22. A series of gradient coils 30, 32, and 34 permit controlled magnetic gradient fields to be generated for positional encoding of certain of the gyromagnetic nuclei within the patient 26 during examination sequences. A radio frequency (RF) coil 36 is provided, and is configured to generate radio frequency pulses for exciting the certain gyromagnetic nuclei within the patient. In addition to the coils that may be local to the scanner 12, the system 10 also includes a set of receiving coils 38 (e.g., a phased array of coils) configured for placement proximal to (e.g., against) the patient 26. The receiving coils 38 may have any geometry, including both enclosed and single-sided geometries.

As an example, the receiving coils 38 can include cervical/thoracic/lumbar (CTL) coils, head coils, single-sided spine coils, and so forth. Generally, the receiving coils 38 are placed close to or on top of the patient 26 so as to receive the weak RF signals (weak relative to the transmitted pulses generated by the scanner coils) that are generated by certain of the gyromagnetic nuclei within the patient 26 as they return to their relaxed state. The receiving coils 38 may be switched off so as not to receive or resonate with the transmit pulses generated by the scanner coils, and may be switched on so as to receive or resonate with the RF signals generated by the relaxing gyromagnetic nuclei.

The various coils of system 10 are controlled by external circuitry to generate the desired field and pulses, and to read emissions from the gyromagnetic material in a controlled manner. In the illustrated embodiment, a main power supply 40 provides power to the primary field coil 28. A driver circuit 42 is provided for pulsing the gradient field coils 30, 32, and 34. Such a circuit may include amplification and control circuitry for supplying current to the coils as defined by digitized pulse sequences output by the scanner control circuit 14. Another control circuit 44 is provided for regulating operation of the RF coil 36. Circuit 44 includes a switching device for alternating between the active and inactive modes of operation, wherein the RF coil 36 transmits and does not transmit signals, respectively. Circuit 44 also includes amplification circuitry for generating the RF pulses. Similarly, the receiving coils 38 are connected to switch 46 that is capable of switching the receiving coils 38 between receiving and non-receiving modes such that the receiving coils 38 resonate with the RF signals produced by relaxing gyromagnetic nuclei from within the patient 26 while in the receiving state, and they do not resonate with RF energy from the transmitting coils (i.e., coil 36) so as to prevent undesirable operation while in the non-receiving state. Additionally, a receiving circuit 48 is provided for receiving the data detected by the receiving coils 38, and may include one or more multiplexing and/or amplification circuits.

Scanner control circuit 14 includes an interface circuit 50 for outputting signals for driving the gradient field coils 30, 32, 34 and the RF coil 36. Additionally, interface circuit 50 receives the data representative of the magnetic resonance signals produced in examination sequences from the receiving circuitry 48 and/or the receiving coils 38. The interface circuit 50 is operatively connected to a control circuit 52. The control circuit 52 executes the commands for driving the circuit 42 and circuit 44 based on defined protocols selected via system control circuit 16. Control circuit 52 also serves to provide timing signals to the switch 46 so as to synchronize the transmission and reception of RF energy. Further, control circuit 52 receives the magnetic resonance signals and may perform subsequent processing before transmitting the data to system control circuit 16. Scanner control circuit 14 also includes one or more memory circuits 54, which store configuration parameters, pulse sequence descriptions, examination results, and so forth, during operation. The memory circuits 54, in certain embodiments, may store instructions for implementing at least a portion of the image processing techniques described herein.

Interface circuit 56 is coupled to the control circuit 52 for exchanging data between scanner control circuit 14 and system control circuit 16. Such data may include selection of specific examination sequences to be performed, configuration parameters of these sequences, and acquired data, which may be transmitted in raw or processed form from scanner control circuit 14 for subsequent processing, storage, transmission and display.

An interface circuit 58 of the system control circuit 16 receives data from the scanner control circuit 14 and transmits data and commands back to the scanner control circuit 14. The interface circuit 58 is coupled to a control circuit 60, which may include one or more processing circuits in a multi-purpose or application specific computer or workstation. Control circuit 60 is coupled to a memory circuit 62, which stores programming code for operation of the MRI system 10 and, in some configurations, the image data for later reconstruction, display and transmission. An additional interface circuit 64 may be provided for exchanging image data, configuration parameters, and so forth with external system components such as remote access and storage devices 18. Finally, the system control circuit 60 may include various peripheral devices for facilitating operator interface and for producing hard copies of the reconstructed images. In the illustrated embodiment, these peripherals include a printer 66, a monitor 68, and user interface 70 including devices such as a keyboard or a mouse.

It should be noted that subsequent to the acquisitions described herein, the system 10 may simply store the acquired data for later access locally and/or remotely, for example in a memory circuit (e.g., memory 56, 62). Thus, when accessed locally and/or remotely, the acquired data may be manipulated by one or more processors contained within an application-specific or general-purpose computer. The one or more processors may access the acquired data and execute routines stored on one or more non-transitory, machine readable media collectively storing instructions for performing methods including the image processing and reconstruction methods described herein.

Further, it should be noted that the MRI system 10 may be utilized to implement a variety of suitable diffusion acquisition schemes in accordance with the embodiments described herein. For example, the MRI system 10 may be utilized to perform a DSI scan. In such embodiments, in operation, the MRI system 10 polarizes a population of spins into a subject, such as a tissue, to produce a set of nuclear magnetic resonance (NMR) signals that include diffusion encoding through a set of randomly distributed q-space encoding gradients representative of a three-dimensional displacement probability distribution function of the spins in the tissue. In various embodiments, the control circuit 52 may be programmed to acquire the MR signal at undersampled q-space encodings, utilize JIR to generate a series of undersampled images, synthesize the MR signal at q-space encodings using a compressed sensing technique, form a set of q-space encodings using the undersampled q-space encodings and the synthesized q-space encodings, and generate an image of an object, as described in more detail below.

Figure 2A:
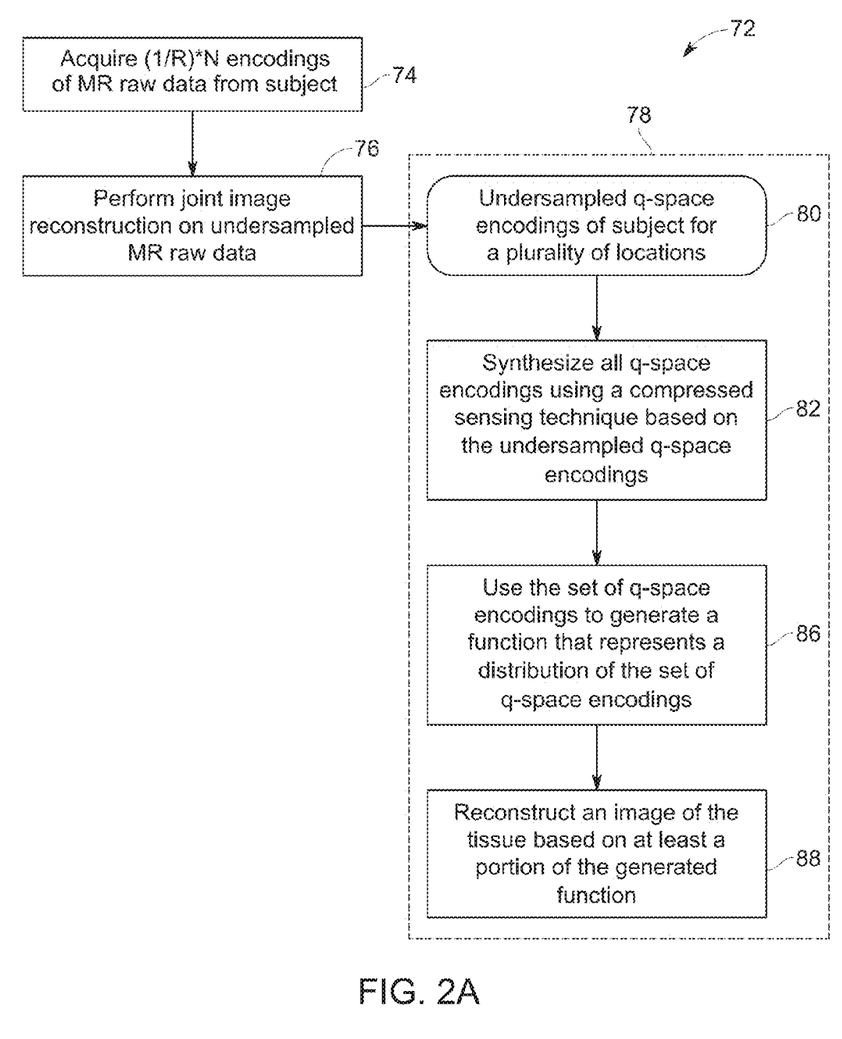
FIG. 2A is a flow diagram illustrating an embodiment of a method that may be utilized to reconstruct an image of a tissue of a subject in accordance with an aspect of the present disclosure.

One such method for reconstructing an image of a tissue is provided in method 72 shown in FIG. 2A. As shown, the method 72 begins with the acquisition of raw MR data of a subject taken at an undersampled quantity of positions (block 74). That is, the MR raw data corresponds to MR signals obtained at undersampled q-space locations for a plurality of q-space locations that are fewer than an entirety of the q-space locations, and the MR signals at the q-space locations represent the three dimensional displacement distribution of the spins in the imaging voxel. For example, in the illustrated embodiment, $(1/R)*N$ encodings of the raw MR data are obtained, in which R is the acceleration factor and N represents the full set of data encodings, where N is typically greater than R. For further example, R may be 4 in one embodiment and, accordingly, one fourth of the entirety of q-space locations may be sampled. Indeed, in some embodiments, the plurality of undersampled q-space locations may correspond to less than one half of the entirety of the q-space locations. In other embodiments, R may be any desired number greater than 1. For example, R may be 2, and one half of the entirety of q-space locations may be sampled. Indeed, the value of R for a given application may depend on a variety of implementation-specific considerations (e.g., the acceptable level of noise or quality of the resulting images) that determine the desired level of acceleration.

Once the raw MR data is obtained in this manner, the method 72 calls for performing joint image reconstruction on the undersampled MR raw data (block 76). The joint image reconstruction may be performed in accordance with the techniques described in the following: Haldar, J. P., Wedeen, V. J., Nezamzadeh, M., Dai, G., Weiner, M. W., Schuff, N. and Liang, Z.-P. (2012), Improved diffusion imaging through SNR-enhancing joint reconstruction. Magnetic Resonance Medicine. doi: 10.1002/mrm.24229, which is hereby incorporated by reference in its entirety. The joint image reconstruction makes use of structural correlations in the images in the acquired data to reduce noise without compromising resolution of the reconstructed images. For example, by performing joint signal-to-noise ratio enhancing reconstruction of the diffusion weighted image sequence directly from the complex raw data, the signal-to-noise ratio may be improved while reducing or preventing the likelihood that significant resolution will be lost.

Once the undersampled raw MR data is processed in this manner to produce a series of $(1/R)*N$ MR images having an improved signal-to-noise ratio, a compressed sensing guided q-space processing 78 is implemented in method 72. The compressed sensing may be performed in accordance with the techniques described in the following: Menzel, M. I., Tan, E. T., Khare, K., Sperl, J. I., King, K. F., Tao, X., Hardy, C. J. and Marinelli, L. (2011), Accelerated diffusion spectrum imaging in the human brain using compressed sensing. Magnetic Resonance Medicine, 66: 1226-1233. doi: 10.1002/mrm.23064; and Marinelli et al., Method and apparatus for performing diffusion spectrum imaging, U.S. Patent Application Publication No. 2012/0249136, Publication Date of Oct. 4, 2012, Ser. No. 13/077,517, which are both hereby incorporated by reference in their entirety.

In general, the compressed sensing guided q-space processing 78 utilizes the (1/R)*N MR images produced from the joint image reconstruction to extract diffusion information. More specifically, for every image pixel in each of the series of images, the compressed sensing reconstruction technique is utilized to exploit the signal sparsity in q-space, thereby enabling faster scans with a reduced quantity of data. This process may be utilized to synthesize the missing data points corresponding to the unsampled locations, and, once obtained, the synthesized data points may be combined with the acquired data points, and the full set of data is processed to yield diffusion parameters that are utilized to determine diffusion maps.

More specifically, the method 72 calls for undersampled q-space encodings of a subject for a plurality of locations to be received with improved signal-to-noise ratio (block 80) as the output of the JIR. The method 72 proceeds by synthesizing all q-space encodings using a compressed sensing technique based on the undersampled q-space encodings (block 82). As will be appreciated, compressed sensing is an image acquisition and reconstruction technique in which it is desired that the image have a sparse representation in a known transform domain (such as the wavelet domain) and that the aliasing artifacts due to q-space undersampling be incoherent in that transform domain (i.e., noise-like). In other words, the data sampling pattern is chosen so as to reduce coherency in the sparse domain. In some embodiments, this incoherence may be achieved by randomly undersampling the q-space encodings.

Once the q-space encodings are synthesized via compressed sensing, the set of q-space encodings may then be used to generate a function that represents a distribution of the set of q-space encodings (block 86). Subsequently, an image of the tissue may be reconstructed based on at least a portion of the generated function (block 88).

Figure 2B:
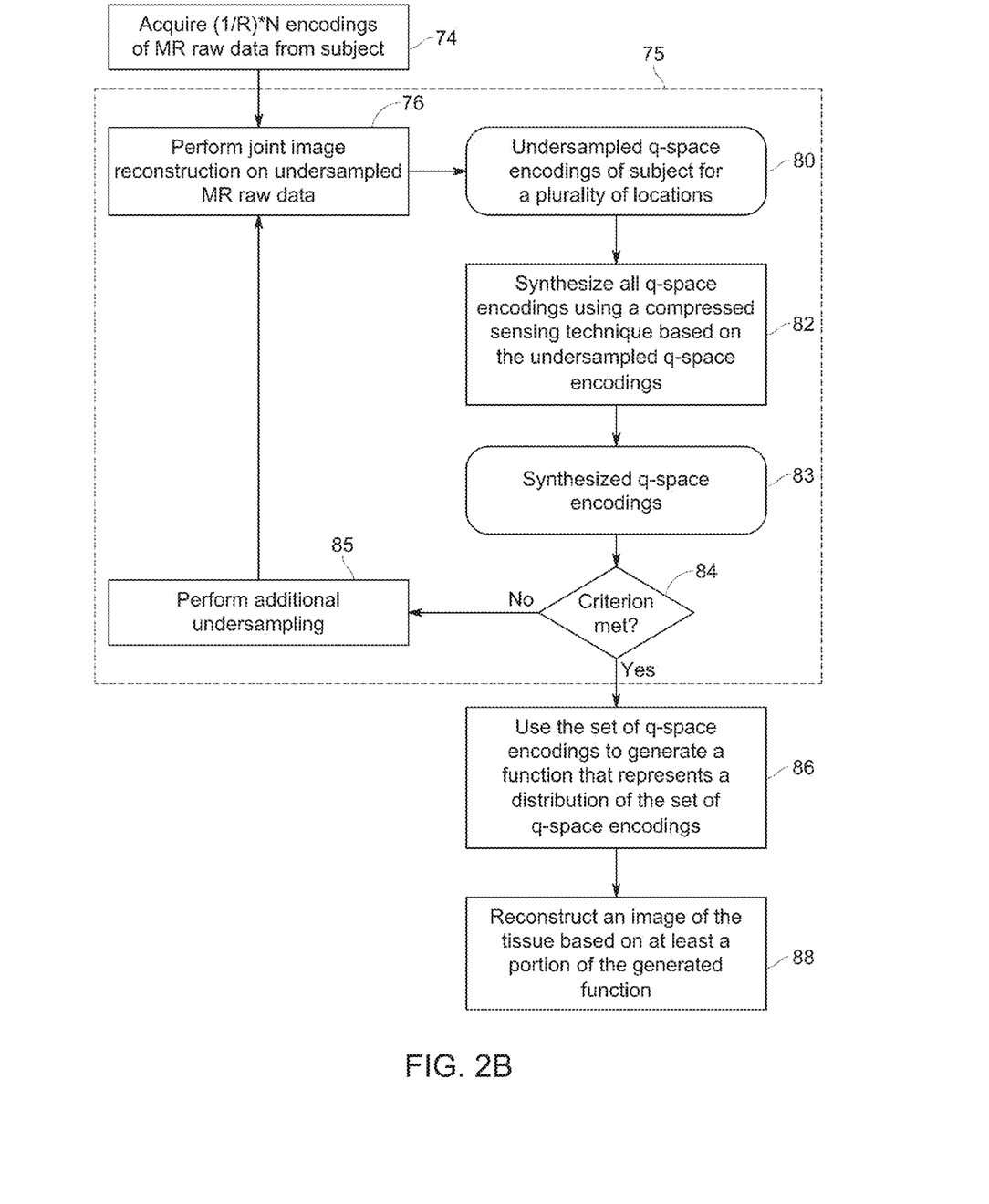
FIG. 2B is a flow diagram illustrating another embodiment of a method that may be utilized to reconstruct an image of a tissue of a subject in accordance with an aspect of the present disclosure.

It should be noted that the method 72 of FIG. 2A may be adapted as an iterative process 75 in some embodiments. For example, as shown in the alternate embodiment of FIG. 2B, once the joint image reconstruction is performed on the undersampled data (block 76) and the q-space encodings (block 83) are synthesized (block 82), an inquiry is performed to check if the desired criterion has been met (block 84). If the criterion is met, the method proceeds as previously described to generate a reconstructed image (blocks 86 and 88). However, in this embodiment, if the desired criterion has not been met, undersampling is repeated (block 85), and joint image reconstruction is performed again (block 76). In this way, JIR and CS reconstruction may be combined in a single iterative process.

Figure 3:
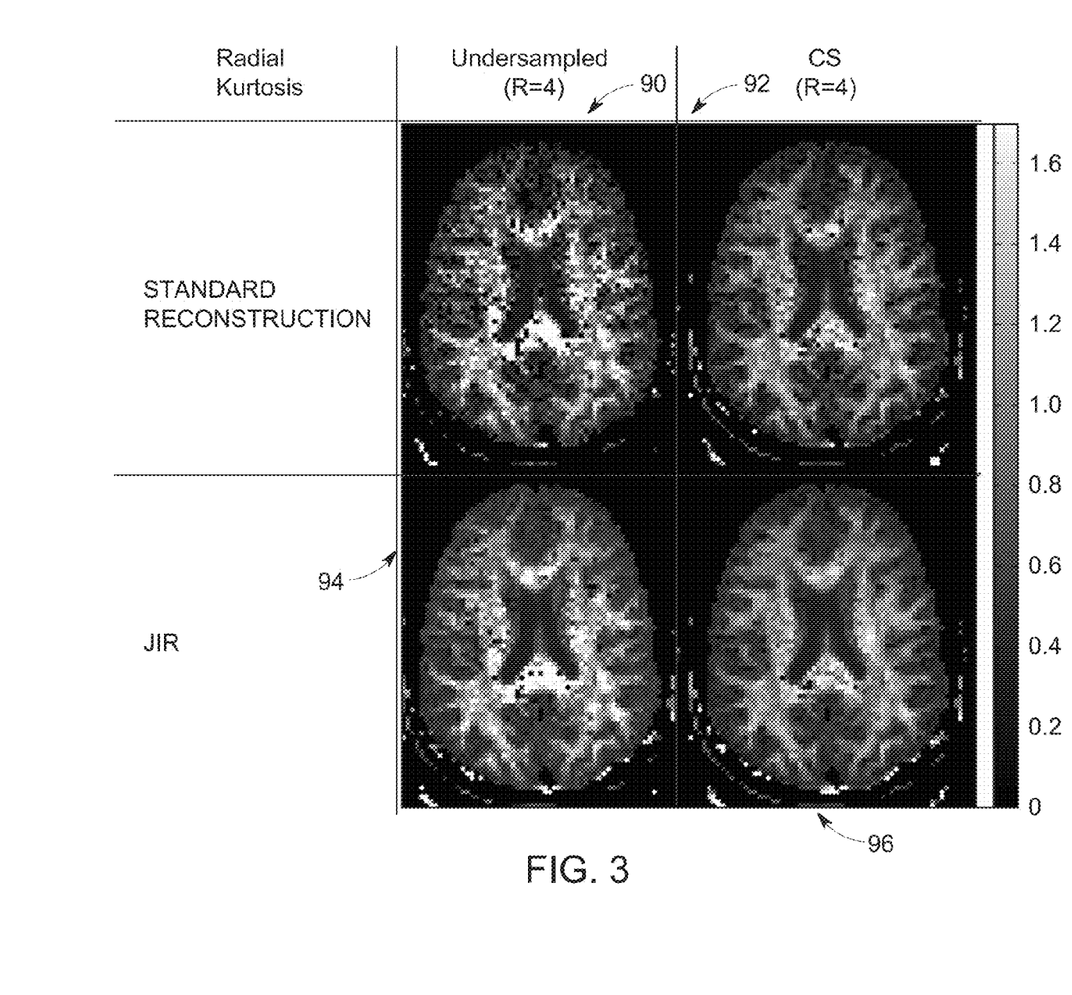
FIG. 3 is an illustration of a comparison between images produced utilizing a plurality of example imaging and q-space processing techniques in accordance with presently disclosed embodiments.

It should be noted that combining the JIR and the CS reconstruction into a single method 72 offers a variety of presently recognized and disclosed advantages over existing systems. These advantages are illustrated and described in more detail below with respect to FIGS. 3 and 4. Specifically, FIG. 3 illustrates images of the radial, or orthogonal, kurtosis obtained using a series of 11 images (i.e., N=11) accelerated by a factor of 4 (i.e., R=4). In particular, FIG. 3 shows a control image 90 obtained using standard reconstruction techniques during imaging and the undersampled set of data points during the q-space processing (i.e., without use of CS). An image 92 is also shown and was obtained using standard reconstruction techniques during imaging and performing compressed sensing reconstruction during q-space processing to obtain a complete set of data. As illustrated by a comparison of image 90 with image 92, by employing compressed sensing during the q-space processing, the noise present in image 92 has been reduced as compared to the noise present in image 90.

FIG. 3 also shows an image 94 obtained using JIR during imaging and the undersampled set of data points during the q-space processing (i.e., without use of CS). Further, an improved image 96 is obtained by coupling JIR during imaging with CS during q-space processing. As illustrated by a comparison of image 94 with image 90, by employing JIR instead of standard reconstruction during imaging, the quality of image 94 is substantially improved compared to image 90. However, the improvements in image 96 compared to image 92 with respect to the q-space processing stage contributions, as well as the improvements in image 96 compared to image 94 with respect to the imaging stage contributions, are substantially greater in image 96 as compared to the reference images 92 and 94. That is, it is now recognized that while JIR and CS operate in orthogonal portions of the acquisition process, improvements contributed by JIR and CS, when combined, result in further improvements beyond those that would be expected.

That is, the image 96 includes improvements that extend beyond the sum of the improvements in images 92 and 94. Accordingly, the improvements provided by utilizing the joint image reconstruction in the imaging domain positively influence the improvements provided by utilizing CS reconstruction in the q-space processing domain, and vice versa, such that by combining JIR and CS, disproportionate improvements are gained, for example, as shown in image 96.

Figure 4:
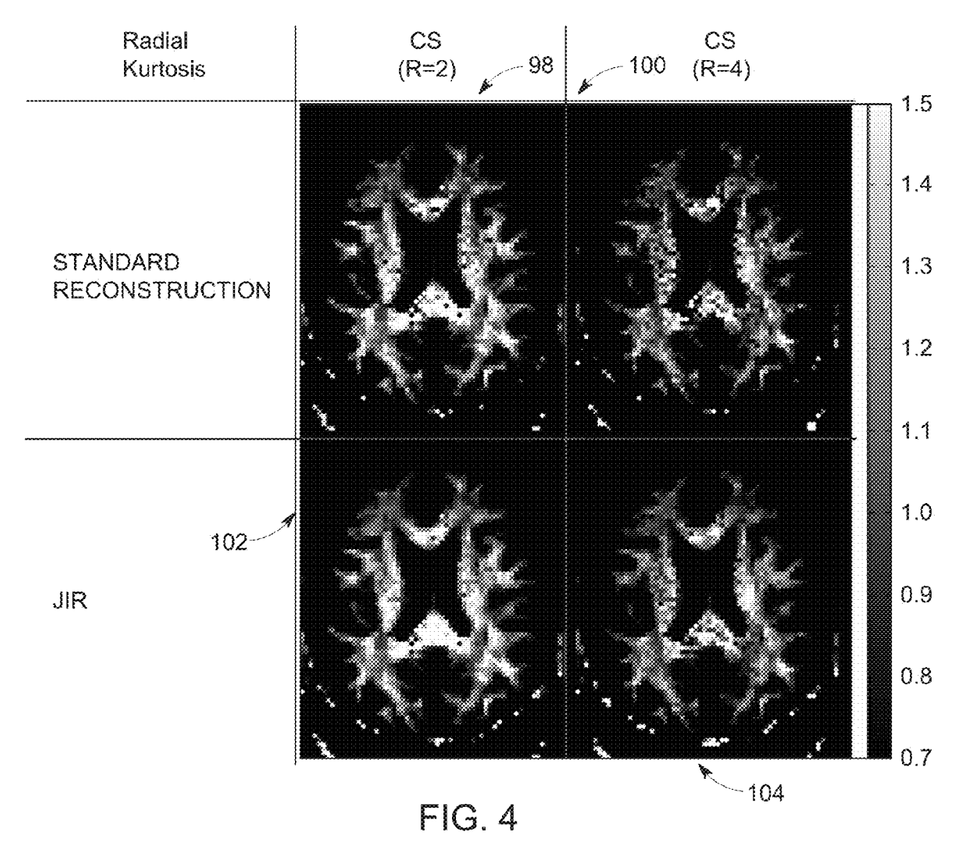
FIG. 4 is an illustration of a comparison between images produced utilizing a plurality of example imaging and q-space processing techniques having varied acceleration factors in accordance with presently disclosed embodiments.

FIG. 4 further illustrates the additional disproportionate benefits gained when JIR is utilized in the imaging stage and CS reconstruction is utilized in the q-space processing stage. Specifically, four images 98, 100, 102, and 104 of the radial kurtosis obtained using a series of 11 images (i.e., N=11) are shown. Image 98 was obtained using standard reconstruction during the imaging stage and CS reconstruction accelerated by a factor of 2 (i.e., R=2) during the q-space processing stage. Image 100 was obtained using standard reconstruction during the imaging stage and CS reconstruction accelerated by a factor of 4 (i.e., R=4) during the q-space processing stage. Image 102 was obtained using JIR during the imaging stage and CS reconstruction accelerated by a factor of 2 (i.e., R=2) during the q-space processing stage. Image 104 was obtained using JIR during the imaging stage and CS reconstruction accelerated by a factor of 4 (i.e., R=4) during the q-space processing stage. As described in more detail below, the images 98, 100, 102, and 104 illustrate one example of how the combination of JIR and CS reconstruction results in improvements beyond the additive effect of utilizing each of the methods separately.

More specifically, while the resulting improvements for the combination of standard image reconstruction and CS reconstruction with R=4 shown in image 100 appears noisier with weaker fiber connections than for image 98 having R=2, the combination of JIR and CS reconstruction with R=4 in image 104 not only yields smoother results due to use of JIR, but also enables visualization of most of the fiber connections such that the overall image quality is substantially similar to the image quality of image 98, which corresponds to the combination of standard image reconstruction and CS reconstruction with R=2. Accordingly, the combination of CS reconstruction with JIR enables use of an acceleration factor of 4 without substantial loss of image information. That is, by combining JIR and CS reconstruction in the presently disclosed manner, a higher acceleration factor may be utilized. This feature may offer advantages over known approaches since the higher acceleration factor enables fewer images to be taken, thus reducing the total acquisition time necessary to obtain an image of a given level of image quality. This reduction in acquisition time may be desirable, for example, in instances in which the subject is a patient being imaged for a medical application.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method of generating a magnetic resonance (MR) image of a tissue, comprising:
    acquiring MR raw data via an imager, wherein the MR raw data corresponds to MR signals obtained at undersampled q-space locations for a plurality of q-space locations that are fewer than an entirety of the q-space locations and wherein the MR signals obtained at the plurality of undersampled q-space locations represent a three dimensional displacement distribution of the spins in an imaging voxel;
    performing, via a processor associated with the imager, a joint image reconstruction technique on the MR raw data in order to exploit structural correlations of the MR raw data in the MR signals in order to obtain an accelerated series of MR images;
    performing, on each image pixel in each MR image of the accelerated series of MR images, a compressed sensing reconstruction technique in order to exploit q-space signal sparsity and in order to identify a plurality of diffusion maps; and
    storing at least one of the plurality of diffusion maps on memory associated with the processor or displaying at least one of the plurality of diffusion maps via a display.

2. The method of claim 1, comprising utilizing the diffusion maps in order to reconstruct, via the processor, one or more images of the tissue.

3. The method of claim 1, wherein the plurality of undersampled q-space locations correspond to one fourth of the entirety of the q-space locations.

4. The method of claim 1, wherein the plurality of undersampled q-space locations corresponds to less than one half of the entirety of the q-space locations.

5. The method of claim 1, comprising inducing a population of polarized spins in the tissue in order to produce a set of nuclear magnetic resonance (NMR) signals, wherein the NMR signals comprise a set of non-uniformly distributed encodings which are utilized in measuring the three-dimensional displacement probability distribution function of the spins in the tissue.

6. The method of claim 1, wherein performing the compressed sensing reconstruction technique comprises synthesizing, via the processor, q-space encodings for a portion of the q-space locations at which MR signals were not acquired.

7. The method of claim 1, wherein performing the joint image reconstruction technique comprises identifying, via the processor, smooth regions and/or edges in the MR signals.

8. A non-transitory computer readable medium encoding one or more executable routines, which, when executed by a processor, cause the processor to perform acts comprising:
    acquiring MR raw data, wherein the MR raw data corresponds to MR signals obtained at undersampled q-space locations for a plurality of q-space locations that are fewer than an entirety of the q-space locations and the MR signals at the q-space locations represent the three dimensional displacement distribution of the spins in an imaging voxel;
    performing a joint image reconstruction technique on the MR raw data in order to exploit structural correlations of the MR raw data in the MR signals in order to obtain an accelerated series of MR images;
    performing a compressed sensing reconstruction technique on each image pixel in each obtained MR image of the accelerated series of MR images in order to exploit q-space signal sparsity and in order to identify a plurality of diffusion maps; and
    storing at least one of the plurality of diffusion maps on memory or displaying at least one of the plurality of diffusion maps via a display.

9. The non-transitory computer readable medium of claim 8, wherein the acts performed by the processor further comprise the processor utilizing the diffusion maps in order to reconstruct one or more images of the tissue.

10. The non-transitory computer readable medium of claim 8, wherein the plurality of undersampled q-space locations corresponds to less than one half of the entirety of the q-space locations.

11. The non-transitory computer readable medium of claim 8, wherein performing the compressed sensing reconstruction technique comprises synthesizing q-space encodings with the processor for a portion of the q-space locations at which MR signals were not acquired.

12. The non-transitory computer readable medium of claim 8, wherein the acts performed by the processor further comprise generating with the processor a set of functions that represent a radial component of diffusion through the tissue and an angular component of diffusion through the tissue.

13. The non-transitory computer readable medium of claim 8, wherein the plurality of undersampled q-space locations correspond to one fourth of the entirety of the q-space locations.

14. A magnetic resonance (MR) system, comprising:
    an imager comprising an MR magnet and being configured to acquire MR raw data, wherein the MR raw data corresponds to MR signals obtained at undersampled q-space locations for a plurality of q-space locations that is less than an entirety of the q-space locations and the MR signals at the q-space locations represent the three dimensional displacement distribution of the spins in an imaging voxel; and
    control circuitry configured to receive the MR raw data, perform a joint image reconstruction technique on the MR raw data in order to obtain an accelerated series of MR images, and perform, for each image pixel in each MR image of the accelerated series of MR images, a compressed sensing reconstruction technique in order to identify a plurality of diffusion maps; and
    memory configured to store at least one of the plurality of diffusion maps or a display configured to display at least one of the plurality of diffusion maps.

15. The system of claim 14, wherein the imager comprises a plurality of gradient field coils, a radiofrequency (RF) transmit coil, and an array of receiving coils.

16. The system of claim 14, wherein the control circuitry is further configured to utilize the diffusion maps in order to reconstruct one or more images of an imaged tissue.

17. The system of claim 14, wherein the control circuitry is further configured to perform the compressed sensing reconstruction technique by synthesizing q-space encodings for a portion of the q-space locations at which MR signals were not acquired.

18. The system of claim 14, wherein the plurality of undersampled q-space locations correspond to one fourth of the entirety of the q-space locations.

19. The system of claim 14, wherein the plurality of undersampled q-space locations corresponds to less than one half of the entirety of the q-space locations.

20. The system of claim 14, wherein the control circuitry is further configured to generate a set of functions that represent a radial component of diffusion through an imaged tissue and an angular component of diffusion through the imaged tissue.

21. The system of claim 14, wherein the imager is configured to acquire the raw MR data by inducing a population of polarized spins in an imaged tissue in order to produce a set of nuclear magnetic resonance (NMR) signals, wherein the produced NMR signals comprise a set of non-uniformly distributed encodings which are utilized in measuring the three-dimensional displacement probability distribution function of the spins in the tissue.

* * * * *